(12) United States Patent
Kinoshita et al.

(10) Patent No.: US 8,772,746 B2
(45) Date of Patent: Jul. 8, 2014

(54) SEMICONDUCTOR MEMORY DEVICE

(75) Inventors: Masaharu Kinoshita, Kokubunji (JP);
Yoshitaka Sasago, Tachikawa (JP);
Takashi Kobayashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 216 days.

(21) Appl. No.: 13/349,653

(22) Filed: Jan. 13, 2012

(65) Prior Publication Data

US 2012/0211717 A1     Aug. 23, 2012

(30) Foreign Application Priority Data

Feb. 21, 2011   (JP) .................................. 2011-034102

(51) Int. Cl.
*H01L 47/00*       (2006.01)

(52) U.S. Cl.
USPC ................................ 257/2; 438/382; 365/148

(58) Field of Classification Search
USPC ................. 257/E21.64, E21.641–E21.669, 2,
257/E45.001, E21.004, E21.645, 5, 1;
365/148, 185.17, 185.18, 96; 438/3
See application file for complete search history.

(56) References Cited

U.S. PATENT DOCUMENTS

| 8,254,160 | B2 | 8/2012 | Murooka et al. |
| 2002/0134997 | A1* | 9/2002 | Ito et al. .......................... 257/210 |
| 2004/0174732 | A1 | 9/2004 | Morimoto |
| 2008/0149913 | A1* | 6/2008 | Tanaka et al. ..................... 257/5 |

FOREIGN PATENT DOCUMENTS

| JP | 2004-272975 A | 9/2004 |
| JP | 2008-160004 A | 7/2008 |

* cited by examiner

*Primary Examiner* — Julio J Maldonado
*Assistant Examiner* — Robert Bachner
(74) *Attorney, Agent, or Firm* — Miles & Stockbridge P.C.

(57) ABSTRACT

A semiconductor memory device in which the cell area can be decreased and the minimum feature size is not restricted by the thickness of the material forming the memory cell. In a semiconductor memory device, a gate insulating film, a channel extending in a direction X, and a resistance change element extending in the direction X are formed successively above multiple word lines extending in a direction Y, and a portion of the channel and a portion of the resistance change element are disposed above each of the plurality of the word lines. Such configuration can decrease the cell area and ensure the degree of design freedom.

6 Claims, 11 Drawing Sheets

| INFORMATION | STATE | RESISTANCE CHANGE ELEMENT 1083 | RESISTANCE CHANGE ELEMENT 1081 | RESISTANCE CHANGE ELEMENT 1082 | SYNTHESIS RESISTANCE |
|---|---|---|---|---|---|
| 0 | 000 | L | L | L | R0 |
| 1 | 001 | H | L | L | R1 (>R0) |
| 2 | 010 | H | L | H | R2 (>R1) |
| 3 | 011 | L | H | L | R3 (>R2) |
| 4 | 100 | L | H | H | R4 (>R3) |
| 5 | 101 | H | H | H | R5 (>R4) |

FIG. 22

SEMICONDUCTOR MEMORY DEVICE

CLAIM OF PRIORITY

The present application claims priority from Japanese patent application JP 2011-034102 filed on Feb. 21, 2011, the content of which is hereby incorporated by reference into this application.

FIELD OF THE INVENTION

The present invention concerns a semiconductor memory device and a manufacturing method thereof and it particularly relates to a semiconductor memory device and a Manufacturing method thereof for storing information and capable of electric rewriting by utilizing a material that changes an electric property when supplying a current to an element.

BACKGROUND OF THE INVENTION

Since non-volatile semiconductor memory devices are excellent in portability and impact resistance, their demand has been extended rapidly in recent years as memory devices for small-size portable information equipments such as portable personal computers or digital steal cameras. For growing the market, increase in the memory density by decreasing of the memory cell area is an important factor and various memory cell systems have been proposed therefor.

Japanese Unexamined Patent Application Publication No. 2004-272975 discloses a resistance change memory device in which multiple memory cells are connected in series in a lateral direction. As shown in FIG. 1 of Japanese Unexamined Patent Application Publication No. 2004-272975, each of the plurality of memory cells has a structure in which a transistor as a selection element and a variable resistance element as a memory element are connected in parallel. As shown in FIG. 5(b) of Japanese Unexamined Patent Application Publication No. 2004-272975, transistors are formed above a substrate and variable resistance elements are formed thereabove. Further, contacts are formed each between the transistor and the variable resistance element for electric connection. Since each of the contacts is used in common between each of adjacent transistors, the number of contacts per cell is decreased and, as a result, the memory cell area is also decreased.

Japanese Unexamined Patent Application Publication No. 2008-160004 discloses a resistance change memory device in which multiple memory cells are connected in series in a vertical direction. The memory cell of Japanese Unexamined Patent Application Publication No. 2008-160004 has a structure in which a transistor as a selection element and a phase change device as a memory elements are connected in parallel in the same manner as Japanese Unexamined Patent Application Publication No. 2004-272975 and a gate insulating film, channel silicon and a phase change element are buried in a hole passing through a structure where gates and insulating films are stacked alternately.

SUMMARY OF THE INVENTION

The invention of JP-2004-272975 involves a problem of requiring a region for forming the contact between the transistor and the variable resistance element to increase the cell area. Specifically, as described in FIG. 5(b) of Japanese Unexamined Patent Application Publication No. 2004-272975, it is necessary to ensure a space by some or other means between the gate and the contact so that the gate (WL) of each transistor and the contact are not conducted by way of the channel (above the substrate). For example, in Japanese Unexamined Patent Application Publication No. 2004-272975, the space is provided by a spacer on the lateral side of the gate WL. When the space is ensured, area penalty is generated. While Japanese Unexamined Patent Application Publication NO. 2004-272975 describes in column 48 that the size of one memory cell can be decreased to 4F2, it is actually difficult to reduce the size of one memory cell to 4F2.

As another problem, since transistors formed above the substrate are used as selection elements in the invention according to Japanese Unexamined Patent Application Publication No. 2004-272975, peripheral circuits have to be provided on a region separately from the memory cell. As a result, this issues a problem that overheads in the peripheral circuit are large and the chip area is increased.

On the other hand, since the invention of Japanese Unexamined Patent Application Publication No. 2008-160004 has the structure of forming materials for the selection element in the hole, the minimum feature size is restricted by the necessary thickness of materials buried in the hole (channel and phase change material). Further, it is difficult to freely design the scale of the memory element to the selection element and the degree of design freedom is restricted for the resistance ratio between the selection element and the memory element.

In view of the above, the present invention intends to provide anon-volatile semiconductor memory device capable of decreasing the cell area and the chip area, not undergoing restriction for the minimum feature size by the thickness of the materials constituting the memory cell and ensuring the degree of design freedom. The foregoing and other objects and novel features of the present invention will become apparent by reading the descriptions of the present specification with reference to the accompanying drawings.

An outline for typical examples of inventions disclosed in the present application is to be described below.

According to one aspect of the present invention, a semiconductor device includes:

multiple first word lines formed above a semiconductor substrate and extending in a first direction parallel to the surface of the semiconductor substrate, a first gate insulating film formed above each of the plurality of the first word lines, a first channel formed above the first gate insulating film, crossing the first direction, and extending in the second direction parallel to the surface of the semiconductor substrate, and a first resistance change element formed above the first channel and extending in the second direction, in which a portion of the first channel and a portion of the first resistance change element are disposed above each of the plurality of first word lines respectively.

According to another aspect of the present invention, a method of manufacturing a semiconductor memory device includes:

(a) forming multiple first word lines above a semiconductor substrate and extending in a first direction parallel to the surface of the semiconductor substrate, (b) forming a first gate insulating film above each of the plurality of the first word lines, (c) forming a first channel above the first gate insulating film, crossing the first direction, and extending in a second direction parallel to the surface of the semiconductor substrate, (d) forming a first resistance change element above the first channel and extending in a second direction, in which a portion of the first channel is disposed above each of the plurality of the first word lines in the step (c) and a portion of the first resistance change element is disposed above each of the plurality of the first word lines in the step (d).

According to the aspects of the present invention, the memory density of the semiconductor memory device can be increased.

DETAILED DESCRIPTION OF THE PREFERRED EMBODIMENTS

First Embodiment

Figure 1:
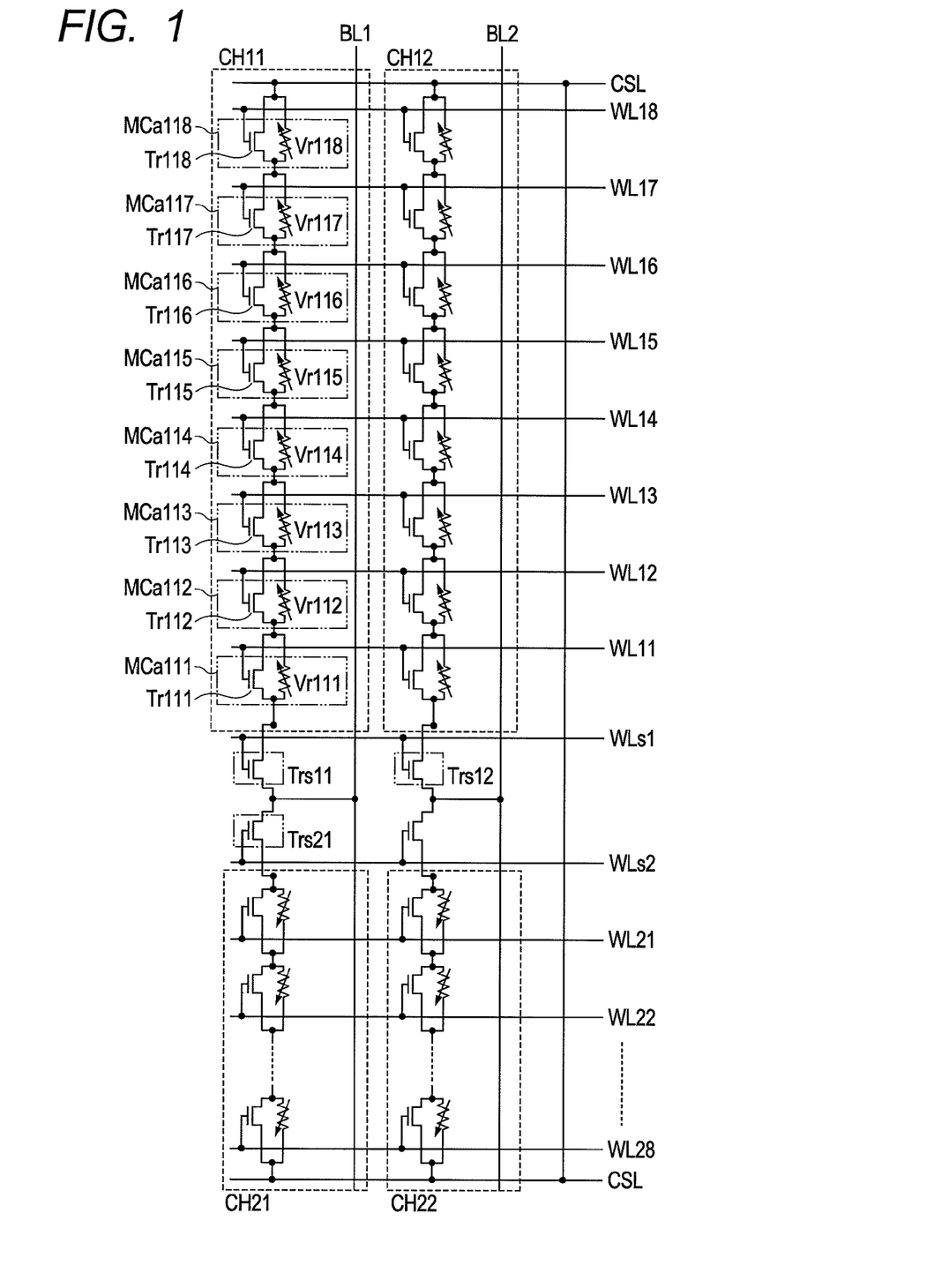
FIG. 1 is a circuit diagram for a main portion of a semiconductor memory device.

FIG. 1 shows a circuit diagram for a portion of a semiconductor memory device to be described in this embodiment. FIG. 1 shows, for example, a memory cell MC111. In the memory cell MC111, a source-drain path of a selection transistor Tr111 and a resistance change element Vr111 are electrically connected in parallel. Further, a string CH11 is formed by connecting memory cells MC11n (n=1, ..., 8) in series, and one end of a string selection transistor Trs11 and one end of the string CH11 are connected electrically. The other end of the string selection transistor Trs11 is electrically connected with a bit line BL1, and the other end of the string CH11 is electrically connected with a common source line CS. The string selection transistor Trs11 is controlled by a word line WLs1.

In a case of operating, for example, the memory cell MC111, the operation of the memory device is performed as below.

At first, for selecting the string CH11, a voltage about at a level of turning the string selection transistor Tr111 to on is applied to the word line WLs1, the common source CSL is kept at the ground level, and a desired voltage is applied to the bit lint BL1. Other string CH21 electrically connected with the bit line BL1 is not selected by applying a voltage about at a level of keeping the string selection transistor Trs21 to off, where current does not flow to the string CH21. A string CH22 is not selected in the same manner as the string CH21. While other string selection transistor Trs12 controlled by the word line WLs1 is turned on, current does not flow to the string CH12 and the string is not selected by setting the bit line BL2 at a potential equal with the common source line CSL. Then, for selecting the memory cell MC111 from the string CH11, a voltage at a level of turning the selection transistor Tr111 to on is applied a word line WL11 to flow the current to the resistance change element Vr111. In this state, in other memory cells MC11n (n=2, ..., 8) contained in the string CH11, since the current flows to the selection transistor Tr11n (n=2, ..., 8) by applying a voltage about at a level of turning the selection transistors Tr11n (n=2, ..., 8), current flows scarcely to the resistance change elements Vr11n (n=2, ..., 8) to on, which is not selected. The resistance of the selection transistor in the on state is lower than the resistance of the resistance change element irrespective of the state of the resistance change element, and the resistance of the transistor in the off state is higher than the resistance of the resistance change element irrespective of the state of the resistance change element.

Information is stored by flowing current to the resistance change element Vr111 after selecting the memory cell MC111 thereby changing the resistance value of the element. For example, when the resistance change element comprises a phase change material, current is flown to the resistance change element thereby generating Joule heat to perform rewriting. The resistance change element shows a higher resistance when the state of phase is amorphous and has a lower resistance when the state of phase is crystalline. For changing the resistance change element to the amorphous state, the phase change material is heated to a melting point or higher temperature and then quenched by interrupting a current. For changing the resistance change element to the crystalline state, the phase change material may be heated to a crystallizing temperature or higher. Information is read by reading a current flowing to the resistance change element Vr111.

Figure 2:
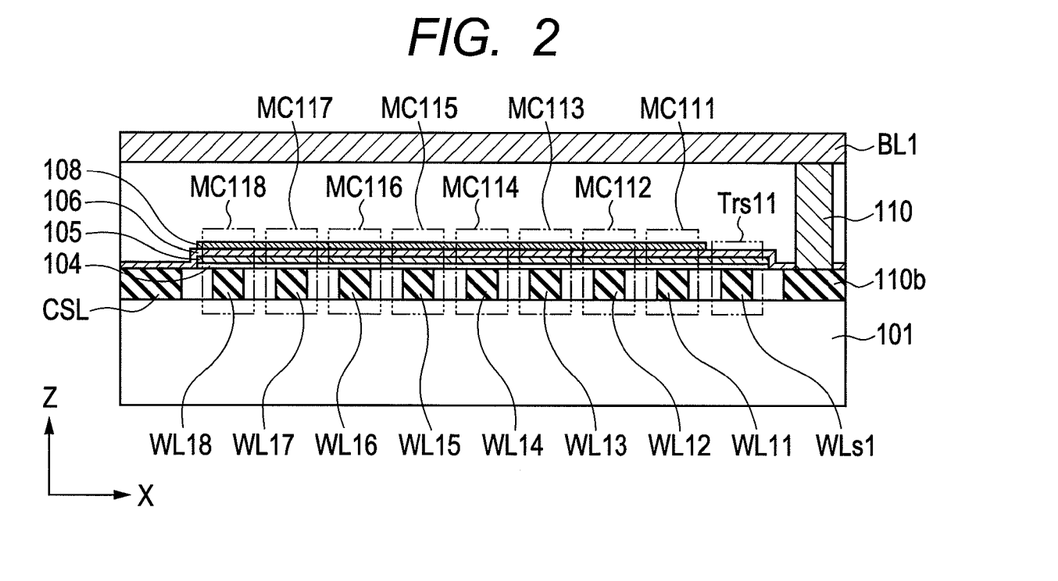
FIG. 2 is a schematic cross sectional view of the main portion of the semiconductor memory device in FIG. 1.

Then, FIG. 2 shows a cross sectional view for a main portion of a semiconductor memory device according to this embodiment. FIG. 2 shows a semiconductor substrate 101 including a peripheral circuit for operating the semiconductor memory device of the invention, word line WLs1, word lines WL1n (n=1, ..., 8), a common source line CSL, a bit line BL1, a string selection transistor Trs11, memory cells MC11n (n=1, ..., 8), an insulating film 104 as a gate insulating film, a second silicon layer 105 and a third silicon layer 106 as a channel silicon layer, resistance change element 108, and an electrode 110 and an electrode 110b for electrically connecting the bit line and the channel silicon. An axis X is set in the direction parallel to the surface of the semiconductor substrate 101, and an axis Z is set in a direction perpendicular to the surface of the semiconductor substrate 101. In the present specification, "above" means the +direction Z.

Figure 3:
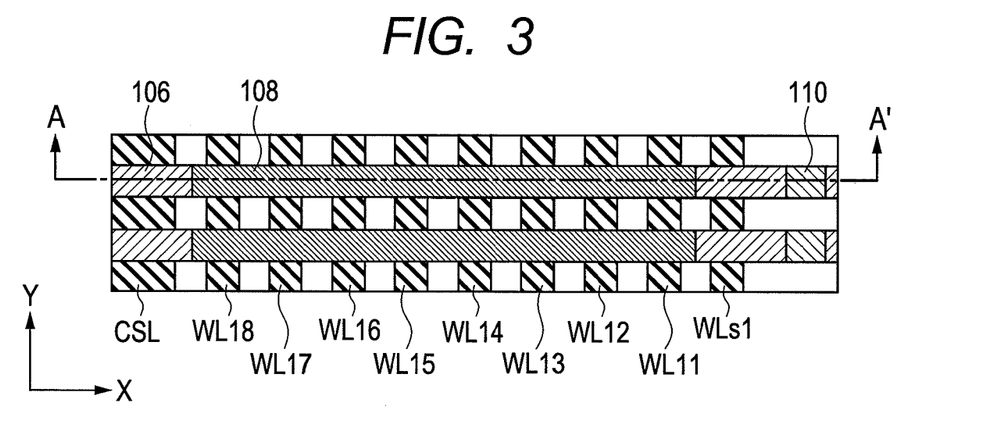
FIG. 3 is an upper plan view for the main portion of the semiconductor memory device in FIG. 2.

FIG. 3 is an upper plan view corresponding to FIG. 2 in which the bit line is not illustrated for the simplicity of the drawing. FIG. 2 is a cross sectional view along plane A-A' in FIG. 3. The string selection transistor Trs1 comprising the word line WLs1, the insulating film 104, the second silicon layer 105, and the third silicon layer 106. For example, the memory cell MC111 comprises the word line WL11, a transistor comprising the insulating film 104, the second silicon layer 105, and the third silicon layer 106, as well as the resistance change element 108. The common source line CSL, the word line WLs1, and the word lines WL1$n$ (n=1, . . . , 8) extend in the direction Y, and the bit line BL1 and the bit line BL2 extend in the direction X. Further, the word line WLs1 and the word lines WL1$n$ (n=1, . . . , 8) are arranged periodically in the direction X at a pitch 2F (F: minimum feature size), and the bit line BL1 and the bit line BL2 are disposed periodically in the direction Y at a pitch 2F. The electrode 110$b$ is not electrically connected with the word line WLs1 and arranged below the electrode 110 for every bit line. While not illustrated, the word line WLs1, the word lines WL1$n$ (n=1, . . . , 8), the common source line CSL, and the bit line BL1 are electrically connected with a peripheral circuit, while this is not illustrated. The axis Y is set in a direction perpendicular to the axis X and the axis Z.

The semiconductor memory device according to this embodiment has a feature as described below. That is, the semiconductor memory device comprises multiple the word lines WL1$n$ (n=1, . . . , 8) formed above the semiconductor substrate and extending in the first direction (direction Y) parallel to the surface of the semiconductor substrate, the gate insulating film 104 formed above each of the plurality of the word lines, the channels 106 formed above the gate insulating film, crossing the first direction, and extending in the second direction (direction X) parallel to the surface of the semiconductor substrate, and the resistance change elements 108 formed above the channels and extending in the second direction, in which a portion of the channel and a portion of the resistance change element are disposed above each of the plurality of the word lines.

Due to such feature, in the invention according to this embodiment, it is not necessary to form a contact between each of the plurality of memory cells each formed of the selection elements each comprising a portion of the word lines, the gate insulating film, and the channel and the memory elements each comprising a portion of the resistance change element. Accordingly, it is free from the problem of the requirement for ensuring the space as described in Japanese Unexamined Patent Application Publication No. 2004-272975 and the cell area can be decreased further. Further, other transistors than those formed directly above the substrate can be used as the selection element. Further, different from Japanese Unexamined Patent Application Publication No. 2008-160004, the film thickness of each of the channels and the resistance change material can be designed freely within a range of satisfying the feature.

Further, the word lines and the channels according to this embodiment further have a feature that they comprise polysilicon. Due to such feature, since the selection element and the resistance change element can be formed above the peripheral circuit formed directly to the substrate, the chip area can be decreased.

Further, the channel according to this embodiment has a further particular feature having a lamination structure of multiple polysilicon layers (105 and 106). Due to such feature, the insulating film 104 is not fabricated directly and the reliability can be improved more.

Further, the semiconductor memory device according to this embodiment has a further feature of having the word lines WLs$n$ (n=1, 2) in which the gate insulating and the channel are formed above the word lines WLs$n$ (n=1, 2) but the resistance change element is not formed. Due to such feature, since the word lines WLs$n$ can be operated not as a memory cell but as a string selection element and more memory cells can be operated selectively to the bit lines and the source lines of an identical number, the memory density can be improved further.

Then, a method of manufacturing the semiconductor memory device according to this embodiment is to be described with reference to FIG. 4 to FIG. 10.

At first, a first silicon layer 102 is deposited above a semiconductor substrate 101 including a peripheral circuit by using a CVD (Chemical Vapor Deposition) technique. The first silicon layer 102 comprises silicon containing an impurity, for example, phosphorus or boron and is deposited as an amorphous form. Then, the first silicon layer 102 is crystallized by laser annealing and the first silicon layer 102 is patterned by using lithography and dry etching to obtain a structure of a schematic cross sectional view shown in FIG. 4.

Figure 4:
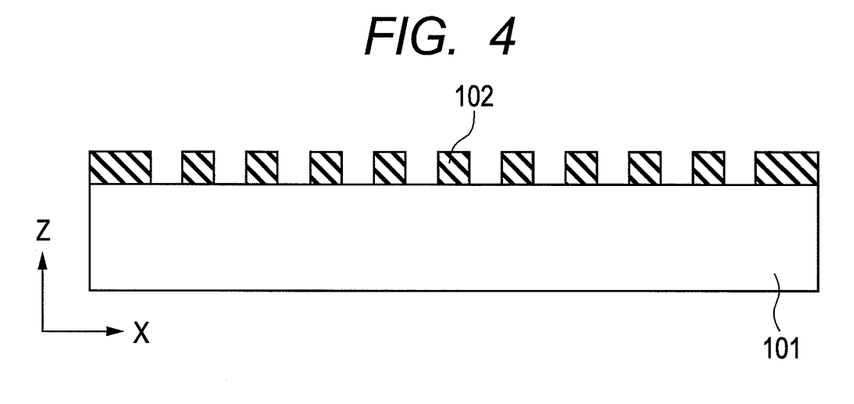
FIG. 4 is a schematic view showing a manufacturing method of a semiconductor memory device.

Succeeding to the step in FIG. 4, an insulating film 103 is buried with no gaps between the first silicon layer 102 by using a CVD technique and the insulating film 103 is planarized by using a CMP (Chemical Mechanical Polishing) technique. The insulating film comprises, for example, silicon oxide or silicon nitride. Then, an insulating film 104 as a gate insulating film and a second silicon layer 105 to form the channel are formed by using a CVD technique to obtain a structure of a schematic cross sectional view shown in FIG. 5. The insulating film 104 comprises, for example, silicon oxide. Further, the second silicon layer 105 comprises silicon at a lower impurity concentration compared with the first silicon layer 102 and is deposited as an amorphous form.

Figure 5:
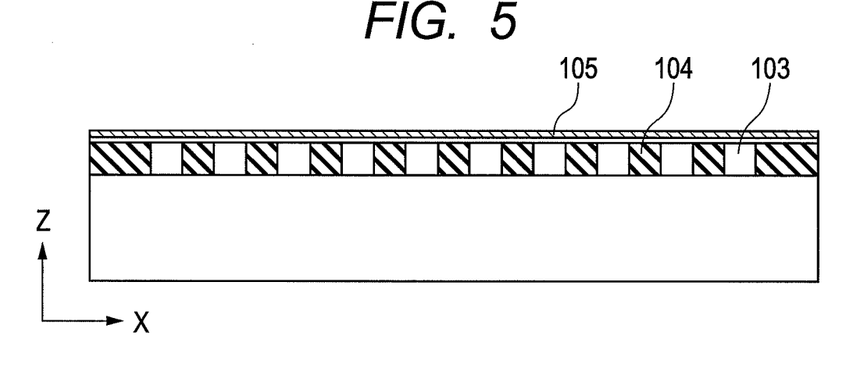
FIG. 5 is a schematic view showing a manufacturing method succeeding to the step in FIG. 4.

Succeeding to the step in FIG. 5, the insulating film 104 and the second silicon layer 105 are patterned by using the lithography and dry etching, and a third silicon layer 106 to form the channel is deposited by using a CVD technique. The third silicon layer 106 comprises silicon at a lower impurity concentration than the first silicon layer 102 and is formed as an amorphous form. Then, the second silicon layer 105 and the third silicon layer 106 are collectively crystallized by laser annealing to obtain a structure of a schematic cross sectional view shown in FIG. 6.

Figure 6:
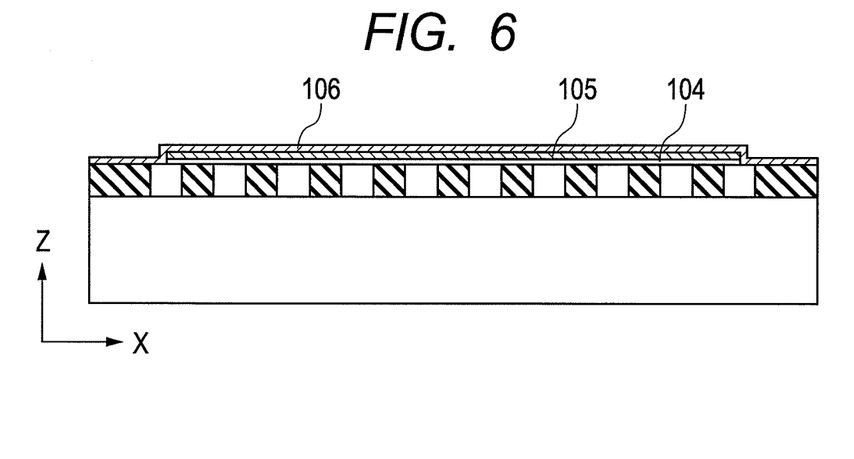
FIG. 6 is a schematic view showing a manufacturing method succeeding to the step in FIG. 5.
Figure 7:
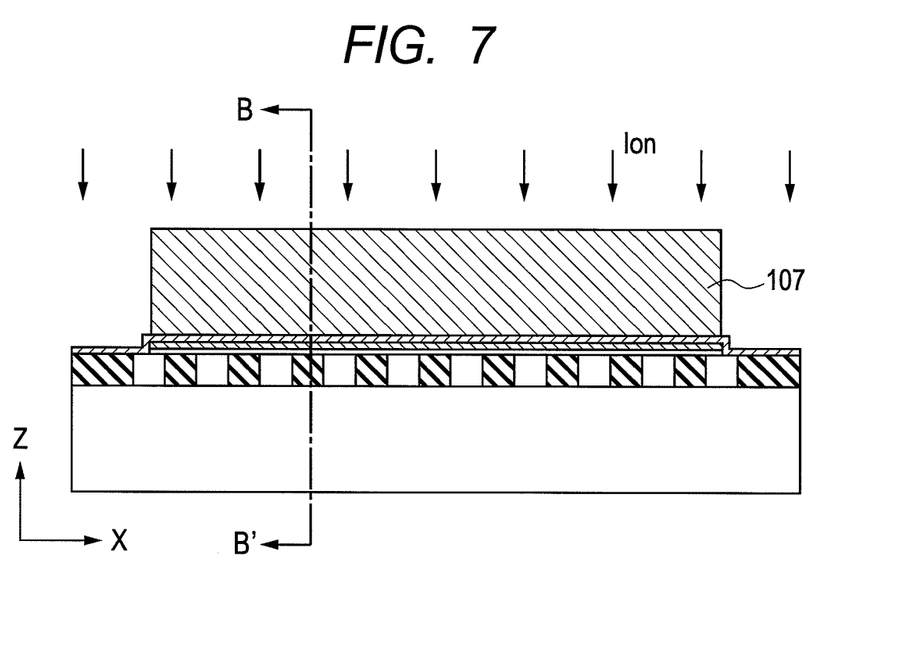
FIG. 7 is a schematic view showing a manufacturing method succeeding to the step in FIG. 6.

FIG. 7 is a schematic cross sectional view for a step of introducing an impurity to a portion of the third silicon layer 106 by using lithography and ion implantation succeeding to FIG. 6. The impurity implanted into the third silicon layer is of a type identical with that introduced into the first silicon layer. After ion implantation, a mask 107 is removed and the impurity is activated by laser annealing. The first silicon layer 102, the second silicon layer 105, and the third silicon layer 106 may be crystallized simultaneously with activation of the impurity described in FIG. 7.

Figure 8:
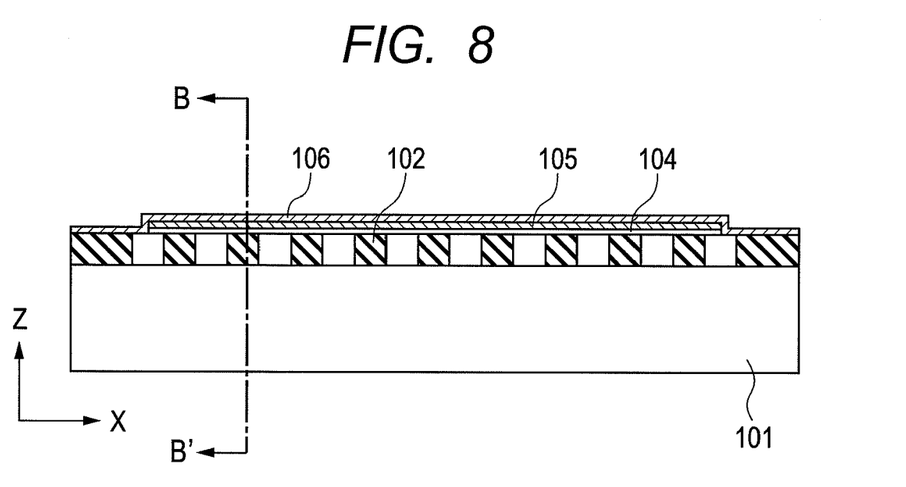
FIG. 8 is a schematic view showing a manufacturing method succeeding to the step in FIG. 7.
Figure 9:
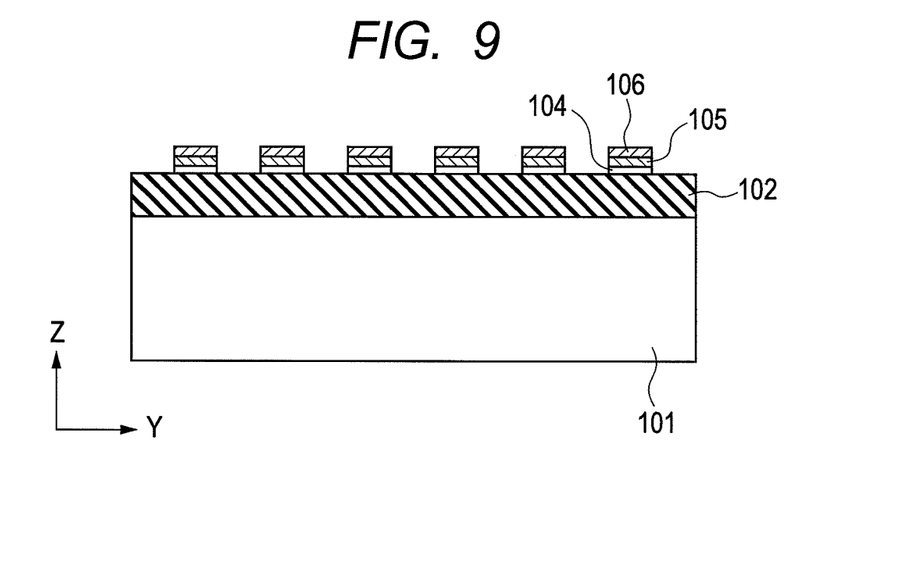
FIG. 9 is a schematic view showing a manufacturing method succeeding to the step in FIG. 8.

After the step described in FIG. 7, the third silicon layer 106, the second silicon layer 105, and the insulating film 104 are patterned by using lithography and dry etching to obtain a structure of a schematic cross sectional view shown in FIG. 8 and FIG. 9. FIG. 9 is a cross sectional view along a plane B-B' in FIG. 8.

Figure 10:
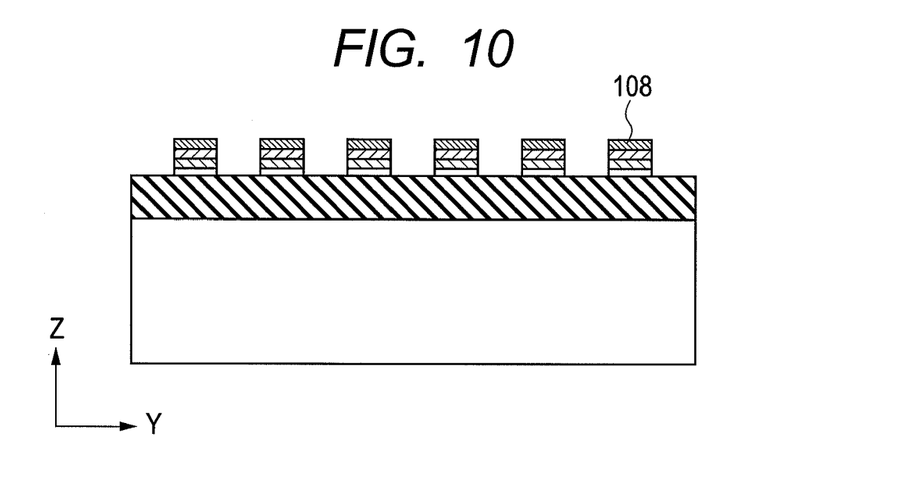
FIG. 10 is a schematic view showing a manufacturing method succeeding to the step in FIG. 9.

Succeeding to the step in FIG. 9, a resistance change element 108 is deposited and the resistance change element 108 is patterned by using lithography and dry etching to obtain a structure of a schematic cross sectional view shown in FIG. 10. The resistance change element 108 comprises a phase change material, for example, $Ge_2Sb_2Te_5$, and information can be recorded and regenerated by utilizing that the resistance value is different depending on the state of the phase change material.

Succeeding to the step in FIG. 10, an interlayer film 109 is deposited and the interlayer film 109 is planarized by using a CMP technique. The interlayer film 109 comprises an insulative material. Then, a hole is formed in the interlayer film 109 by using lithography and dry etching. After depositing an electrode 110 by using a CVD technique, the electrode 110 is planarized by using a CMP technique. Further, an electrode 111 is, deposited by using a CVD technique and the electrode 111 is patterned by using lithography and dry etching to manufacture a semiconductor memory device of this embodiment shown in FIG. 2 and FIG. 3. The electrode 110 and the electrode 111 comprise, for example, tungsten W.

As described above, the method of manufacturing the semiconductor memory device according to this embodiment includes:
(a) a step of forming the first word lines above the semiconductor substrate and extending in the first direction parallel to the surface of the semiconductor substrate (FIG. 4),
(b) a step of forming the gate insulating film above each of the plurality of word lines (FIG. 5),
(c) a step of forming a channel above the gate insulating film, crossing the first direction, and extending in the second direction parallel to the surface of the semiconductor substrate (FIG. 6), and
(d) a step of forming the resistance change element above the channel and extending in the second direction (FIG. 8), in which a portion of the first channel is disposed above each of the word lines in the step (c), and a portion of the first resistance change element is disposed above each of the plurality of the first word lines in the step (d). With the feature described above, an advantageous effect due to the structure of the present invention described above is provided.

Second Embodiment

Then, a structure of a semiconductor memory device according to a second embodiment and a manufacturing method thereof are to be described.

Succeeding to the step in FIG. 4, an insulating film 103 is buried with no gaps between the first silicon layer 102 and after planarizing the insulating film 103 by using a CMP technique, an insulating film 104 as a gate insulating film is formed by using a CVD technique. Then, after patterning the insulating film 104 by using lithography and dry etching, and forming a second silicon layer 112 to form the channel by using a CVD technique, the second silicon layer 112 is crystallized by laser annealing to obtain a structure of a schematic cross sectional view shown in FIG. 11. The second silicon layer 112 comprises silicon at a lower impurity concentration than the first silicon layer 102 and it is deposited as an amorphous film.

Figure 11:
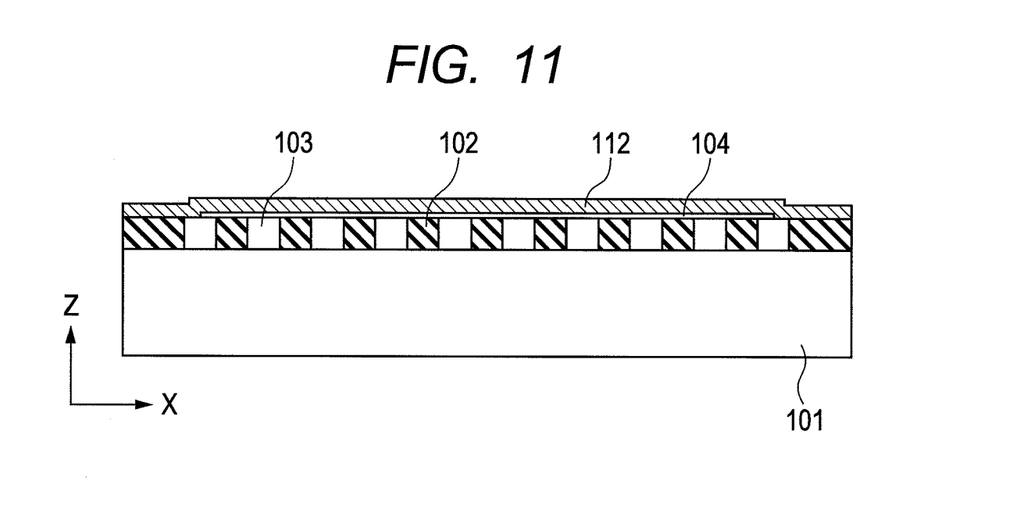
FIG. 11 is a schematic view showing a manufacturing method succeeding to the step in FIG. 4.

The semiconductor memory device according to this embodiment has a feature of forming the channel not forming a third silicon layer but using the second silicon layer 112 as the single silicon layer after fabrication of the insulative film 104. The structure of this embodiment and the manufacturing method thereof may have a possibility of lowering the reliability of the transistor, since the insulating film 104 is fabricated directly compared with the case of forming the channel by the second silicon layer and the third silicon layer in FIG. 6. However, since the channel is formed by the single silicon layer, a boundary is not formed in the silicon of the channel an advantageous effect capable of improving the on current of the transistor can be provided.

Third Embodiment

Then, a manufacturing method according to a third embodiment is to be described. In this embodiment, after the step described in FIG. 7, a sacrificial layer 113 is deposited by using a CVD technique and the sacrificial layer 113, and the third silicon layer 106, the second silicon layer 105, and the insulating film 104 are patterned by using lithography and dry etching to obtain a structure of a schematic cross sectional view shown in FIG. 12. The direction of the cross section in FIG. 12 corresponds to a plane B-B' in FIG. 7. The sacrificial layer 113 comprises, for example, silicon nitride.

Figure 12:
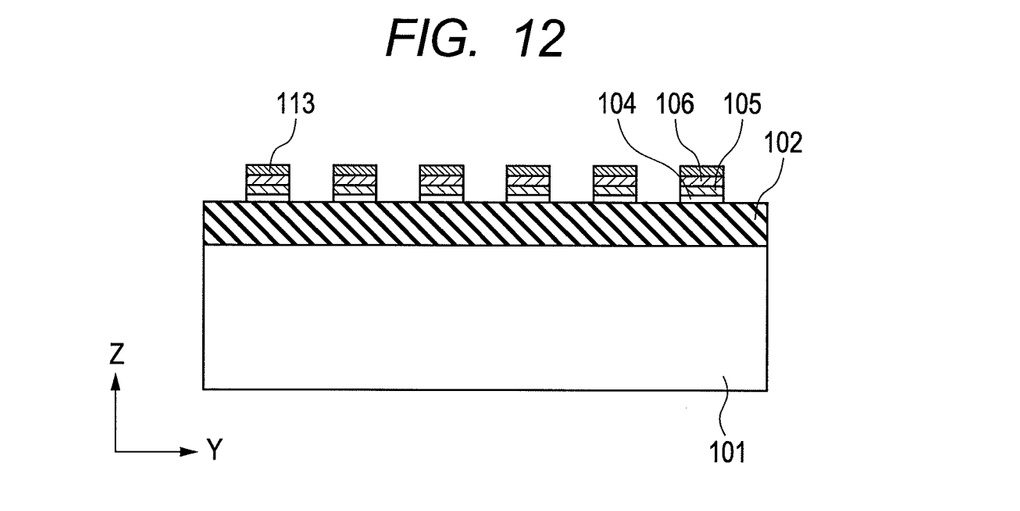
FIG. 12 is a schematic view showing a manufacturing method succeeding to the step in FIG. 7.
Figure 13:
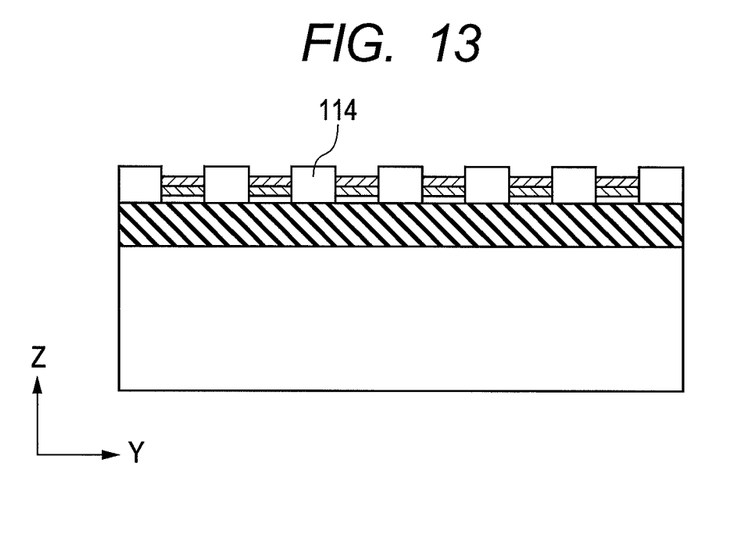
FIG. 13 is a schematic view showing a manufacturing method succeeding to the step in FIG. 12.

Succeeding to the step in FIG. 12, after depositing the interlayer film 114 by using a CVD technique and planarizing the interlayer film 114 by a CMP technique, the sacrificial layer 113 is removed by etching to obtain a structure of a schematic cross sectional view shown in FIG. 13. The interlayer film 114 comprises an insulative material.

Figure 14:
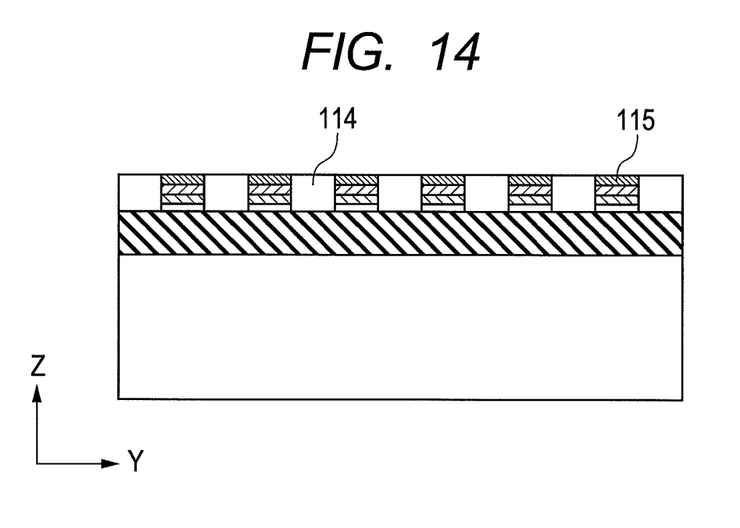
FIG. 14 is a schematic view showing a manufacturing method succeeding to the step in FIG. 13.

Succeeding to the step in FIG. 13, a resistance change element 115 is deposited and the resistance change element 115 is planarized by a CMP technique to obtain a structure of a schematic cross sectional view shown in FIG. 14. The resistance change element 115 comprises a phase change material, for example, $Ge_2Sb_2Te_5$.

The manufacturing method according to this embodiment has a feature of using the sacrificial layer 113 for forming the resistance change element 115. That is, the method further has a step (e) of forming the sacrificial layer above the channel after the step (c) and before the step (d), and a step (f) of forming the interlayer film on the lateral side of the gate insulating film, the first channel, and the sacrificial layer after the step (e) and before the step (d), in which the sacrificial layer is removed and the first resistance change element is formed in the space from which the sacrificial layer has been removed in the step (d). In this manufacturing method, while the number of manufacturing steps increases compared with the method of forming the resistance change element by lithography and dry etching in FIG. 10, the method provides an advantageous effect of not causing dry etching damage to the resistance change element 115 and an advantageous effect capable of preventing misalignment between the resistance change element 115 and the third silicon layer 106, so that variation of the rewrite characteristic of the memory device can be decreased.

Fourth Embodiment

Then, a structure and a manufacturing method of a semiconductor memory device according to a fourth embodiment are to be described. Succeeding to the step in FIG. 10, an interlayer film 109 is deposited by using a CVD technique, and the interlayer film 109 is planarized by using a CMP technique. The interlayer film 109 comprises an insulative material. Then, after forming a hole in the internally film 109 by using lithography and dry etching and depositing an electrode 110 by using a CVD technique, the electrode 110 is planarized by using a CMP technique. After forming the structure obtained as described above in plurality further in the upper layer, the electrode 111 is deposited by using a CVD technique and the electrode 111 is patterned by using lithography and dry etching to manufacture a structure of a schematic cross sectional view shown in FIG. 15.

As a result, the semiconductor memory device of this embodiment has a feature of further comprising multiple the second word lines formed above the first resistance change elements and extending in the first direction, the second gate insulating film formed above each of the plurality of the second word lines, the second channels formed above the second insulating film and extending in the second direction, the second resistance change elements formed above the second channels and extending in the second direction, the first source line connected to one end of the first channel and one end of the second channel, and a second source line connected to the other end of the first channel and the other end of the second channel, in which a portion of the second channels and a portion of the second resistance change elements are disposed above each of the plurality of the second word lines.

Figure 15:
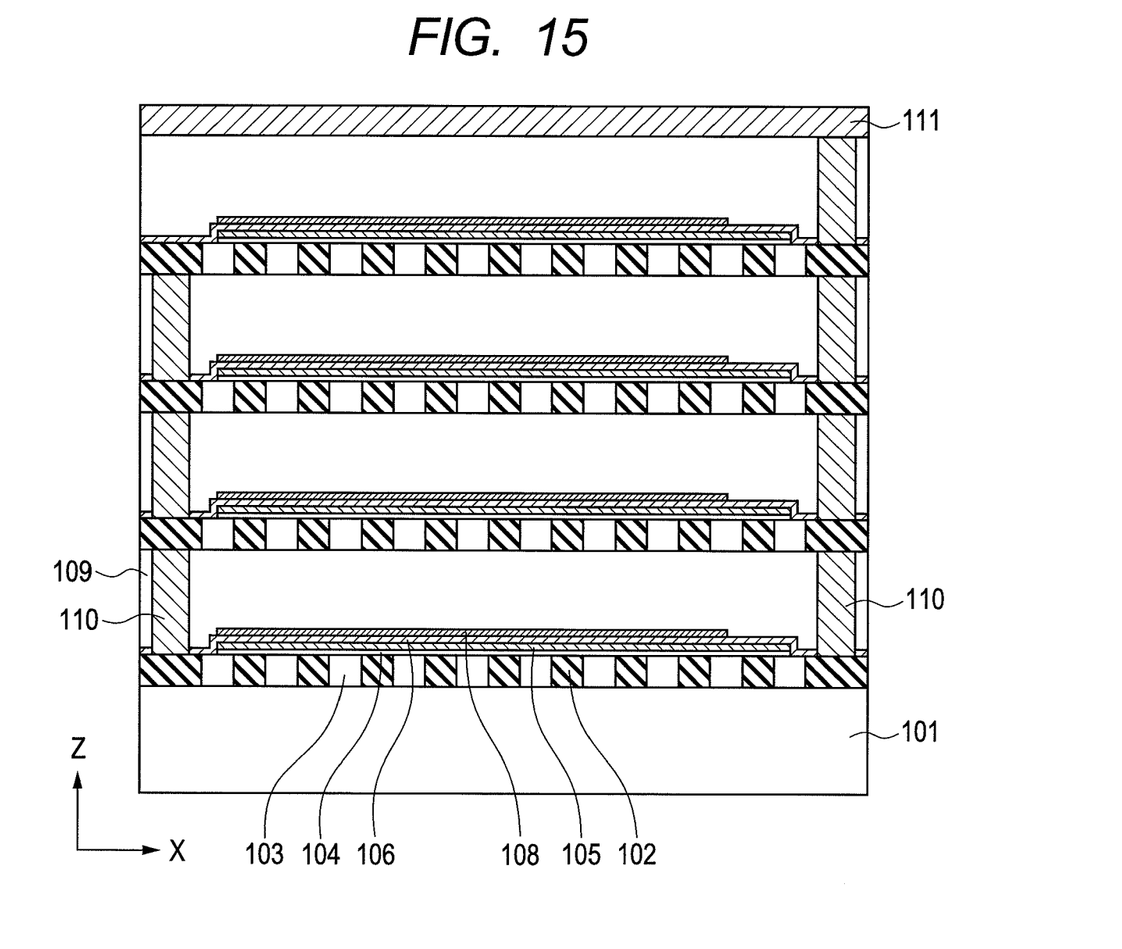
FIG. 15 is a schematic cross sectional view of a main portion of a semiconductor memory device.

In the structure of this embodiment and the manufacturing method thereof, while the number of manufacturing steps is increased compared with the first embodiment, an advantageous effect capable of increasing the memory density can be provided. While FIG. 15 shows a semiconductor memory device having four laminates, the number of laminates is not restricted to four, and the effect of increasing the memory density can be obtained so long as the number of laminates is two or more.

Fifth Embodiment

Figure 16:
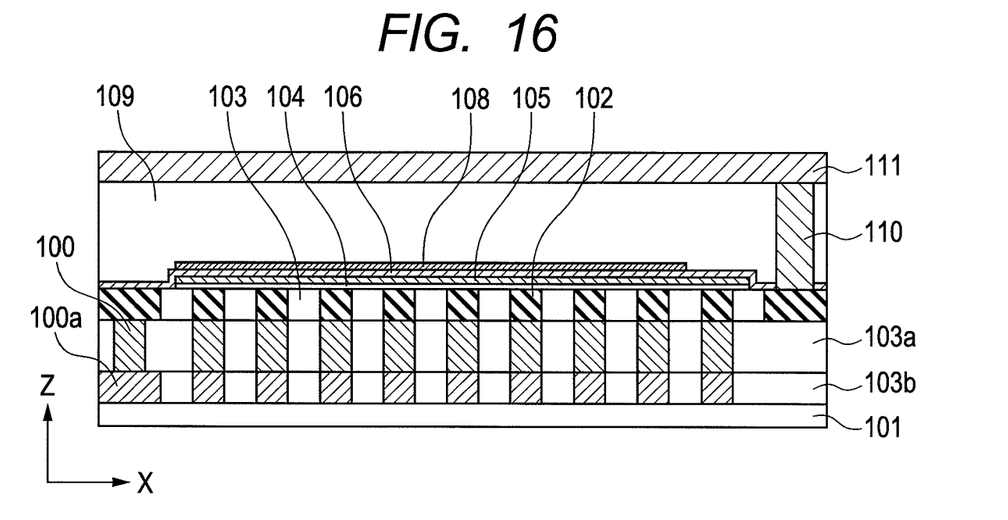
FIG. 16 is a schematic cross sectional view of a main portion of a semiconductor memory device.

Then, a structure of a semiconductor memory device and a manufacturing method thereof according to a fifth embodiment are to be described. In this embodiment, a structure of a schematic cross sectional view shown in FIG. 16 is obtained by forming electrodes 100 and electrodes 100a before formation of the structure described in FIG. 4, and performing the manufacturing method described in FIG. 4 to FIG. 10. The electrodes 100a extend in the direction Y and are disposed periodically at a 2F pitch in the direction X. The electrode 100 is present at the intersections between the electrode 100a and the bit line and disposed below the first silicon layer 102. That is, the semiconductor memory device according to this embodiment has a feature of further comprising multiple the first electrodes formed below each of the plurality of the word lines and electrically connected with corresponding word lines and extending in the first direction among the plurality of the word lines.

In the structure and the manufacturing method thereof of this embodiment, while the number of manufacturing steps is increased compared with the first embodiment, an advantageous effect capable of decreasing the wiring resistance of the common source line and the word lines can be provided.

Sixth Embodiment

Then, a structure of a semiconductor memory device and a manufacturing method thereof of a sixth embodiment are to be described. In this embodiment, the first silicon layer 102 of the semiconductor memory device shown in FIG. 16 comprises a lamination film of a first silicon layer 102 and a metal film 116, to manufacture a structure of a schematic cross sectional view shown in FIG. 17. The metal film 116 preferably comprises, for example, TiN.

Figure 17:
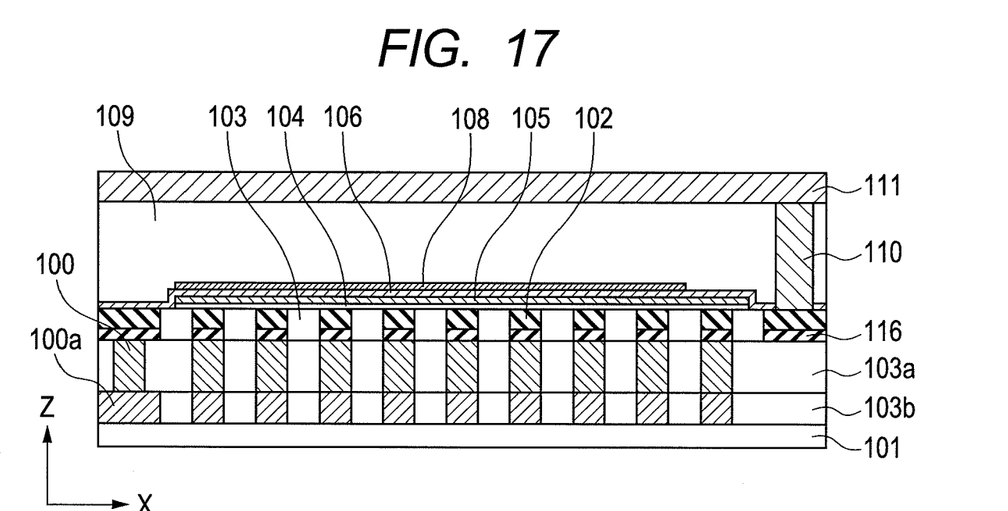
FIG. 17 is a schematic cross sectional view of a main portion of a semiconductor memory device.

In the structure of this embodiment and the manufacturing method thereof, since the electrode 100 and the metal film 116 are in contact to each other, contact resistance can be decreased, the inter-diffusion between the first silicon layer 102 and the electrode 100 can be prevented and, further, the sheet resistance of the gate of the selection element can be decreased compared with the first embodiment.

Seventh Embodiment

Then, a structure of a semiconductor memory device and a manufacturing method thereof of a seventh embodiment are to be described. In this embodiment, the resistance change element 108 in FIG. 10 comprises a lamination film of a resistance change element 108 and an anti-diffusion film 108a, to manufacture the structure of a schematic cross sectional view shown in FIG. 18. The anti-diffusion film 108a preferably comprises a material having a heat conductivity lower than that of silicon and preferably comprises a metal oxide, a metal nitride, or a metal oxynitride. Since the anti-diffusion film 108a is detected as resistance upon reading information, it should have a sufficiently low resistance in the direction perpendicular to the substrate and a sufficiently high resistance in the horizontal direction relative to the substrate so as not to form the leak path. Accordingly, it is necessary that the thickness of the anti-diffusion film 108a is sufficiently thin and it is preferably, for example, 10 nm or less.

Figure 18:
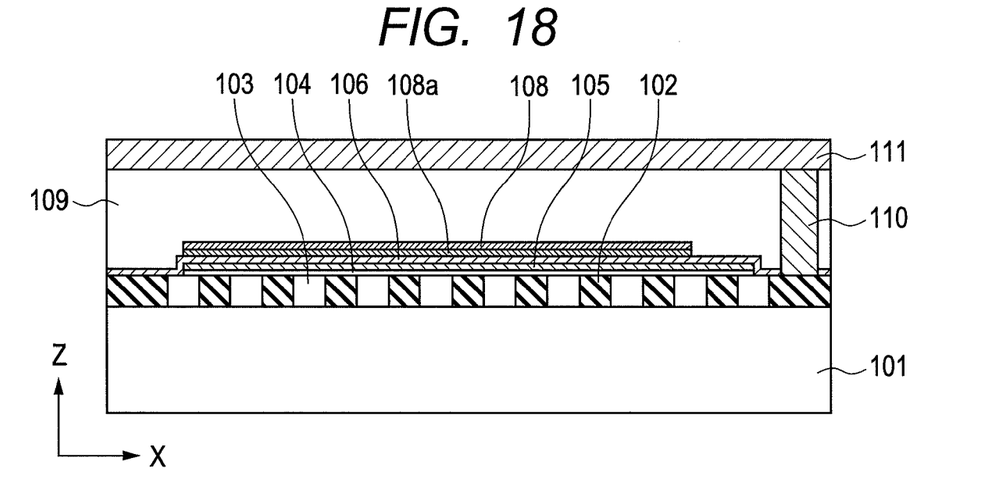
FIG. 18 is a schematic cross sectional view of a main portion of a semiconductor memory device.

In the structure of this embodiment and the manufacturing method thereof, since the inter-diffusion between the resistance change element 108 and the third silicon layer 106 can be inhibited, it has an advantageous effect capable of improving the number of rewrite cycle of the memory device compared with the first embodiment. Further, in a case of a semiconductor memory device of recording information by the resistance change element 108 due to Joule heat, since the thermal diffusion can be prevented by the anti-diffusion film 108a, an advantageous effect capable of decreasing the rewrite current can be obtained.

Eighth Embodiment

Figure 19:
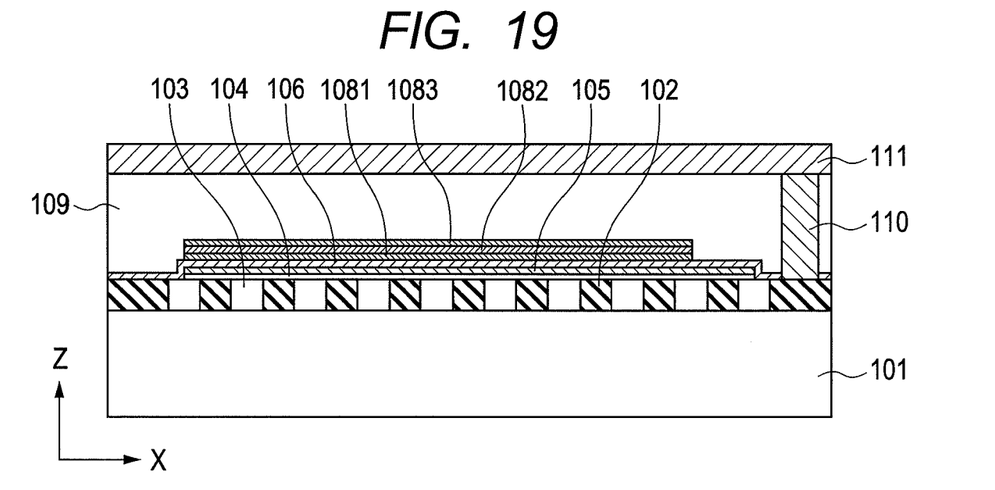
FIG. 19 is a schematic cross sectional view of a main portion of a semiconductor memory device.
Figure 20:
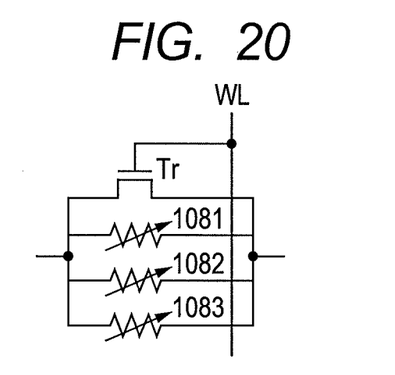
FIG. 20 is a circuit diagram for the main portion of the semiconductor memory device in FIG. 19.
Figure 21:
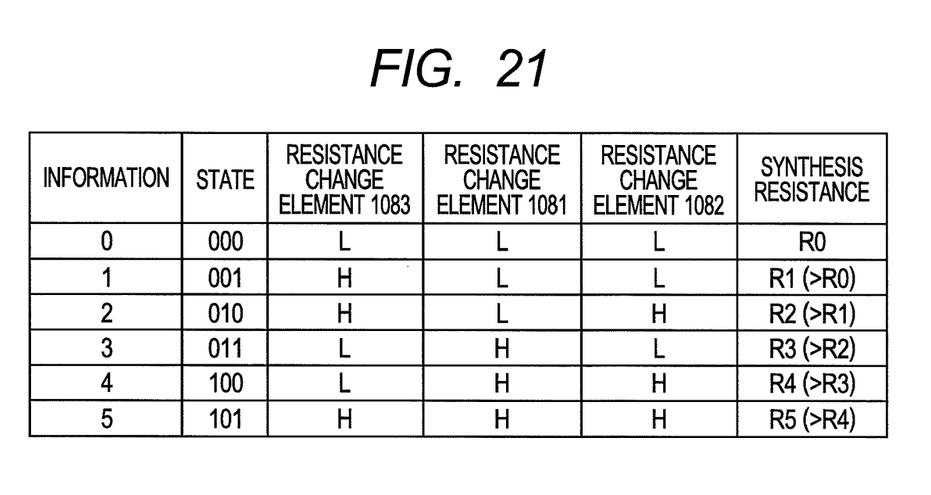
FIG. 21 is a table showing a relative relation between the memory information and the synthesis resistance of the semiconductor memory device in FIG. 18.

Then, a structure of a semiconductor memory device and a manufacturing method thereof according to an eighth embodiment are to be described. In this embodiment, the resistance change element 108 in FIG. 10 comprises a lamination film of a resistance change element 1081, a resistance change element 1082, and a resistance change element 1083, to manufacture a structure of a schematic cross sectional view shown in FIG. 19. The memory cell of this system has a structure in which a selection transistor Tr and a resistance change element 1081, a resistance change element 1082, and a resistance change element 1083 are connected in parallel. An equivalent circuit diagram is shown in FIG. 20. This embodiment of this system has a feature of enabling multi-value recording by combination of the resistance state of each of the resistance change elements. The selection method for the memory cell is identical with that for the semiconductor memory device explained with reference to FIG. 1. In the information recording, after selecting the memory cell, Joule heating is performed appropriately to control the resistance values of the plurality of the resistance change elements 1081•1082•1083 respectively. In the information reading, the synthesis resistance value of the plurality of resistance change elements is distinguished by the current value. FIG. 21 shows a relative relation between the recorded information 0 to 5, and the resistance and the synthesis resistance of each of the resistance change elements 1081•1082•1083. The corresponding relation in the table has a feature of defining the combination of the resistance for each of the resistance change elements 1081•1082•1083 so that a desired synthesis resistance can be obtained in accordance with recorded six information 0 to 5. For example, when information 0 is recorded, all of the resistance states of the three resistance change elements 1081•1082•1083 are controlled to a low resistance ("L" in the table). In the table, the synthesis resistance R0 is lowest and the state is represented by "000". In another example, when information 1 is recorded, only the resistance change element 1083, among the three resistance change elements 1081•1082•1083, is controlled to a high resistance state ("H" in the table) to obtain a synthesis resistance R1 higher than the synthesis resistance R0. In a further example, when information 5 is recorded, all of the resistance states of the three resistance change elements 1081•1082•1083 are controlled to a high resistance to obtain the highest synthesis resistance R5 for attaining the state "101". The method of this embodiment has an advantageous effect capable of increasing the memory density since multi-value recording is possible compared with the manufacturing method described in FIG. 4 to FIG. 10. While description has been made in this method to an example where the resistance change element comprises three resistance change elements, the number for the sets of the phase change material forming the resistance change element is not restricted only to three since multi-value recording is possible by forming the phase change materials by n sets (n≥2). The anti-diffusion film may be disposed between the channel and each of the resistance change elements.

Ninth Embodiment

Figure 22:
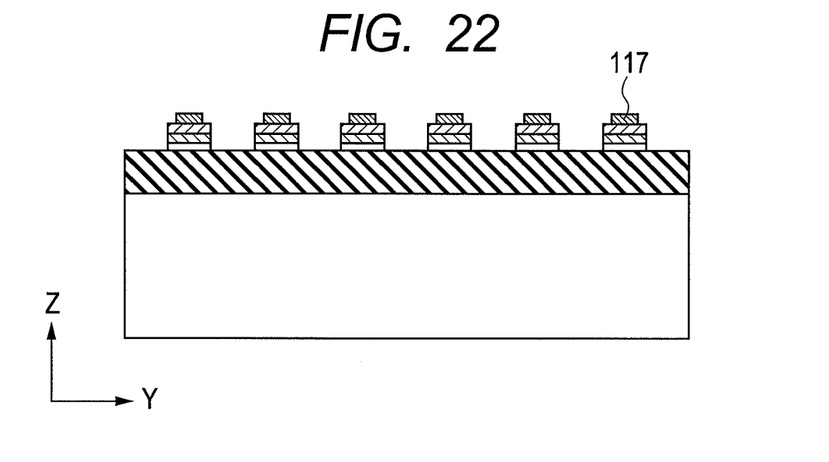
FIG. 22 is a schematic view showing a manufacturing method succeeding to the step in FIG. 9.

Then, a structure of a semiconductor memory device and a manufacturing method thereof according to a ninth embodiment are to be described. In this embodiment, a structure of a schematic cross sectional view shown in FIG. 22 is obtained by sliming a mask for patterning the resistance change element 108 formed in FIG. 10 and forming a resistance change element 117 at a size smaller than the minimum feature size in the direction Y. Then, the interlayer film 109 is deposited by using a CVD technique and the interlayer film 109 is planarized by using a CMP technique. The interlayer film 109 comprises an insulative material. Then, after forming a hole in the interlayer film 109 by using lithography and dry etching and depositing the electrode 110 by using a CVD technique, the electrode 111 is planarized by using a CMP technique. Further, the electrode 111 is deposited by using a CVD technique and the electrode 111 is patterned by using lithography and dry etching to manufacture the semiconductor memory device.

The structure of this embodiment and the manufacturing method thereof have an advantageous effect of enabling low power operation since the cross sectional area of the resistance change element 117 is smaller than that of the first embodiment.

As described above, by using the semiconductor memory device of the invention, since it is not necessary to form the contact between the memory cells, the cell area can be decreased. Further, since the memory cell is formed above the interlayer film, the chip area can be decreased. Further, since the minimum feature size is not restricted depending on the thickness of the material forming the memory cell, refinement is possible along with the progress in the lithography. In this embodiment, the material of the resistance change element is not restricted to the phase change material but may be, for example, nickel oxide or titanium oxide.

The techniques described in the present specification can be properly combined within the range not conflicting to each other. For example, the lamination technique described with reference to FIG. 15 and the technique of multi-value recording described with reference to FIG. 19 can be combined. It is apparent that the embodiment can be modified appropriately within a range of the concept of the present invention.

What is claimed is:

1. A semiconductor memory device, comprising:
a plurality of first word lines formed above a semiconductor substrate and extending in a first direction parallel to the surface of the semiconductor substrate;
a first gate insulating film formed above each of the plurality of first word lines;
a first channel formed above the first gate insulating film, crossing the first direction, and extending in a second direction parallel to the surface of the semiconductor substrate;
a first resistance change element formed above the first channel and extending in the second direction, in which a portion of the first channel and a portion of the first resistance change element are disposed above each of the plurality of the first word lines respectively; and
a third word line formed above the semiconductor substrate and extending in the first direction,
wherein the first gate insulating film and the first channel are formed above the third word line, and
wherein the first resistance change element is not formed above the third word line.

2. The semiconductor memory device according to claim 1, wherein the plurality of the word lines and the first channel each comprise a polysilicon layer.

3. The semiconductor memory device according to claim 1, wherein the first channel has a lamination structure comprising a plurality of polysilicon layers.

4. The semiconductor memory device according to claim 1, wherein the first gate insulating film comprises silicon oxide.

5. The semiconductor memory device according to claim 1, wherein the first resistive change material comprises a phase change material.

6. The semiconductor memory device according to claim 5, wherein the phase change material is $Ge_2Sb_2Te_5$.

* * * * *